(12) United States Patent
Pang

(10) Patent No.: US 6,218,240 B1
(45) Date of Patent: Apr. 17, 2001

(54) METHOD OF FABRICATING LOW VOLTAGE COEFFICIENT CAPACITOR

(75) Inventor: Shu-Koon Pang, Hsinchu Hsien (TW)

(73) Assignee: Taiwan Semiconductor Mfg. Co., Ltd., Hsinchu (TW)

( * ) Notice: Subject to any disclaimer, the term of this patent is extended or adjusted under 35 U.S.C. 154(b) by 0 days.

(21) Appl. No.: 09/328,980

(22) Filed: Jun. 9, 1999

(30) Foreign Application Priority Data

Apr. 7, 1999 (TW) ................................................ 88105506

(51) Int. Cl.⁷ ................................................ H01L 21/8242

(52) U.S. Cl. ............................ 438/253; 438/396; 438/532

(58) Field of Search ..................................... 438/253, 254, 438/255, 396, 397, 398, 532

(56) References Cited

U.S. PATENT DOCUMENTS

| | | | | |
|---|---|---|---|---|
| 5,057,447 | * | 10/1991 | Paterson | 438/253 |
| 5,108,941 | * | 4/1992 | Paterson et al. | 438/396 |
| 5,130,267 | * | 7/1992 | Kaya et al. | 438/453 |
| 5,393,691 | * | 2/1995 | Hsu et al. | 438/210 |
| 5,683,931 | * | 11/1997 | Takahashi | 438/253 |
| 6,033,965 | * | 3/2000 | Lin et al. | 438/395 |
| 6,090,656 | * | 7/2000 | Randazzo | 438/239 |

* cited by examiner

*Primary Examiner*—Carl Whitehead, Jr.
*Assistant Examiner*—Toniae M. Thomas
(74) *Attorney, Agent, or Firm*—Jiawei Huang; J C Patents

(57) ABSTRACT

A method for forming a low voltage coefficient capacitor. A doped polysilicon layer is formed in a region predetermined to form a capacitor and a doped polysilicon layer is formed in a region predetermined to form a gate. A silicide layer is formed on the doped polysilicon layer serving as a bottom electrode of a capacitor.

18 Claims, 3 Drawing Sheets

US 6,218,240 B1

METHOD OF FABRICATING LOW VOLTAGE COEFFICIENT CAPACITOR

CROSS-REFERENCE TO RELATED APPLICATION

This application claims the priority benefit of Taiwan application serial no. 88105506, filed Apr. 7, 1999, the full disclosure of which is incorporated herein by reference.

BACKGROUND OF THE INVENTION

1. Field of the Invention

The present invention relates to a method for fabricating a semiconductor device. More particularly, the present invention relates to a method for fabricating a low voltage coefficient capacitor.

2. Description of the Related Art

As the integration of an integrated circuit (IC) is increased by implementing deep sub-micron processes, the dimensions of all devices composing the IC are reduced. With the help of the reduction in the dimension of the devices, the operation speed of the devices can be increased.

The operation speed of a device is not only determined by the layout of an internal circuit density of the device, but is also affected by the material used for fabricating the device. The material used for fabricating the device plays an important role in increasing operation speed of the device when the integration of elements in an integrated circuit (IC) increases to approach deep sub-micron processes. For example, as logic devices approach to a 0.18-$\mu$m process, copper conductive wires, instead of aluminum conductive wires, are used in a multi-level metallization process to increase the operation speed.

Furthermore, the distance between a capacitor and a transistor in a dynamic random access memory (DRAM) is reduced due to the improvement in the process technology. Therefore, transmission time (or operation time) between the capacitor and the transistor is decreased, that is, that the operation speed is increased.

Conventionally, a top electrode and a bottom electrode of a capacitor in a DRAM are made of polysilicon. Because the polysilicon has a higher voltage coefficient, the operation speed of the capacitor is limited. Therefore, the overall performance of a DRAM can barely keep up with the performance of any present main board or center process unit (CPU). As a result, the operation speed of DRAM becomes the bottleneck of a computer system.

SUMMARY OF THE INVENTION

The present invention provides a method for fabricating a low voltage coefficient capacitor to improve the performance of the capacitor.

The invention provides a method for fabricating a low voltage coefficient capacitor. A substrate is provided, wherein the substrate has a first region for forming a capacitor and a second region for forming a gate. A gate dielectric layer is formed over the substrate, and then a polysilicon layer is formed on the gate dielectric layer. A first dielectric layer is formed on the polysilicon layer, after that the first dielectric layer in the first region is patterned. A doped polysilicon region is formed in the polysilicon layer in the first region. A silicide layer conformal to the substrate is then formed thereon, and a second dielectric layer is formed on the silicide layer. Next, a condutive layer is formed on the second dielectric layer. A capacitor structure is formed on the doped polysilicon region in the first region by patterning the conductive layer, the second dielectric layer and the silicide layer. Then, the first dielectric layer is removed. A gate structure is formed in the second region by patterning the polysilicon layer and the gate dielectric layer. A healing process is performed to recover defects in the exposed surfaces of the capacitor structure and the gate structure. Next, a lightly doped drain is formed in the second region. Spacers are formed on each sidewall of the capacitor structure, the gate structure and the doped polysilicon region, respectively. Then, a source/drain region is formed in the second region.

In the invention, a photomask is used for forming a doped polysilicon layer in a region predetermined to form a capacitor and a doped polysilicon layer in a region predetermined to form a gate. A silicide layer is formed on the doped polysilicon layer serving as a bottom electrode of a capacitor.

The invention is compatible with the existing process and is simple for a person skilled in the art to incorporate it into the existing process.

The invention provides a method for fabricating a low voltage coefficient capacitor to enhance the capacitor performance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
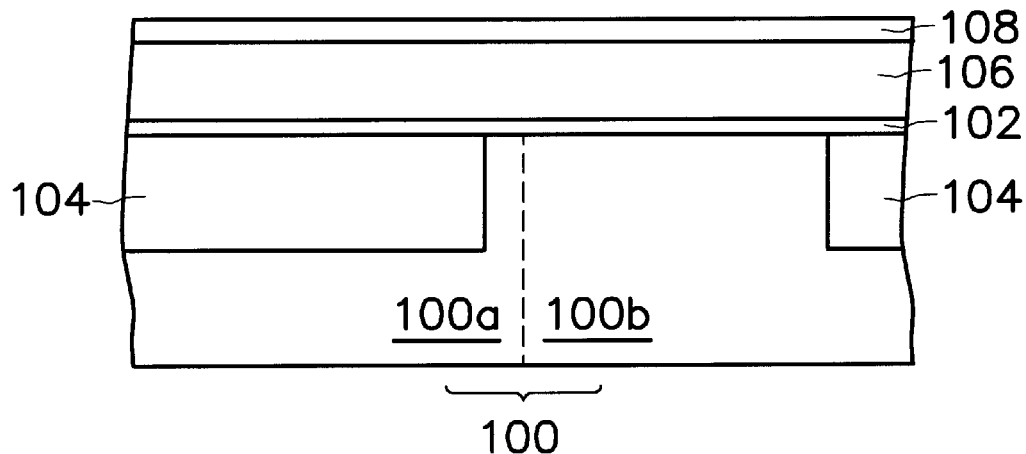
FIGS. 1A through 1F are schematic, cross-sectional views showing the progression of the manufacturing steps for a low voltage coefficient capacitor in accordance with the preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic, cross-sectional views showing the progression of the manufacturing steps for a low voltage coefficient capacitor in accordance with the preferred embodiment of the present invention.

Referring to FIG. 1A, a substrate 100 having isolation structures 104 is provided, wherein the isolation structures 104 are, for example, shallow trench isolation (STI) structures. A gate dielectric layer 102 is formed on the substrate 100, wherein the gate dielectric layer 102 is made from a material such as silicon oxide.

The substrate 100 can be divided into two regions 100*a* and 100*b*, respectively. In subsequent processes, a capacitor structure is formed in the region 100*a* and a gate structure is formed in the region 100*b*, for example.

A polysilicon layer 106 is formed on the gate dielectric layer 102, wherein the polysilicon layer 106 is, for example, undoped. A dielectric layer 108 is formed, for example, by plasma enhanced chemical vapor deposition (PECVD) over the polysilicon layer 106. The dielectric layer 108 is about 350 angstroms thick. The dielectric layer 108 is made from a material such as silicon nitride or silicon oxide, which is produced by using tetra-ethyl-ortho-silicate (TEOS) as a reaction gas.

Figure 1B:
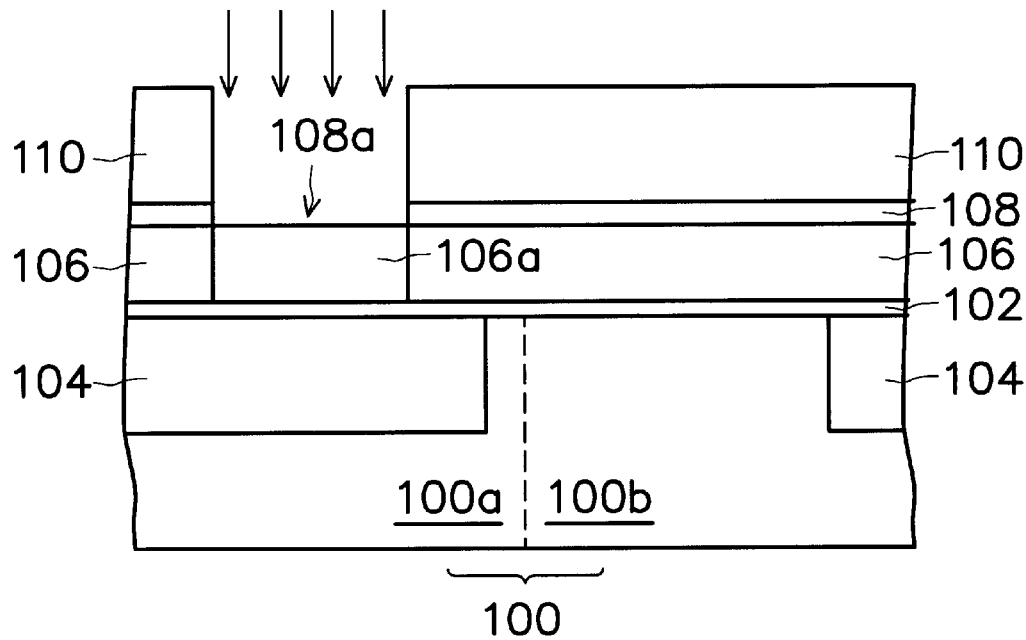

Referring to FIG. 1B, a photoresist layer 110 is formed on the dielectric layer 108, and then a photolithography and etching process is performed to form an opening 108a in the region 100a.

Ions are implanted into the polysilicon layer 106 underlying the opening 108a by doping process to form a doped polysilicon region 106a. The doping process is preferably an ion implantation process, and dosage of the dopant is about 5E15 ions/cm$^2$.

Figure 1C:
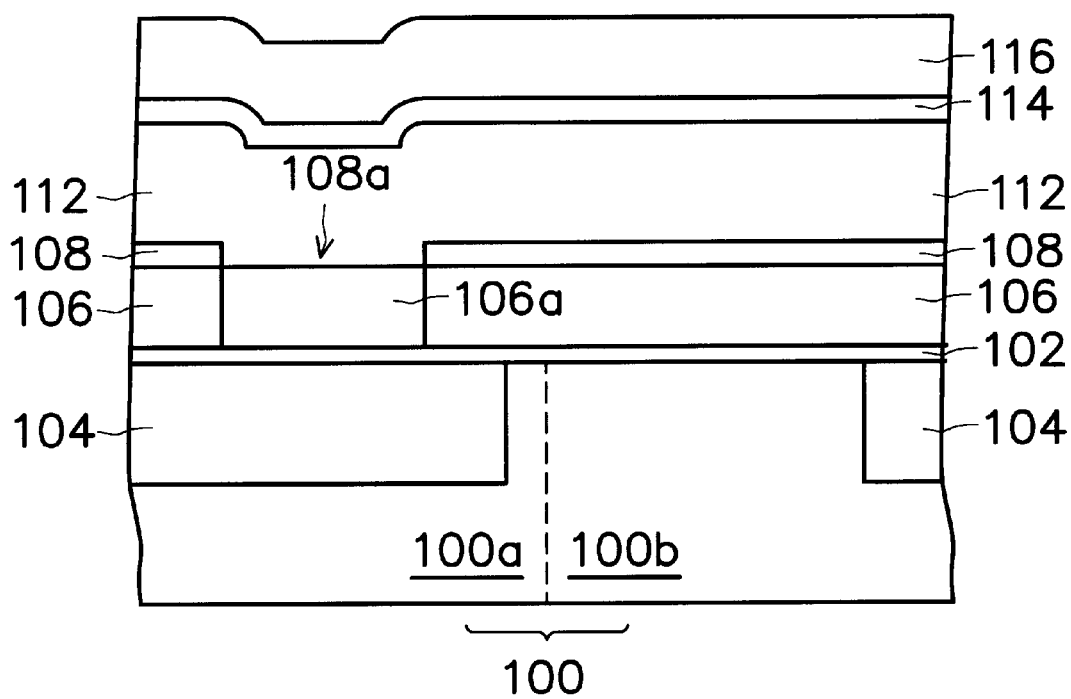

Referring to FIG. 1C, the photoresist layer 110 is removed, for example, by wet etching.

A silicide layer 112 is formed on the dielectric layer 108 and the doped polysilicon layer 106a. The silicide layer 112 is formed along the top surface profile of the substrate 100. The silicide layer 112 is made of a material such as tungsten silicide (WSi$_2$). A thickness of the silicide layer 112 is about 1000 angstroms. The silicide layer 112 has a low voltage coefficient, so that the operation speed and performance of the subsequently formed device are enhanced.

A dielectric layer 114 is formed on the silicide layer 112, wherein the dielectric layer 114 is made from a material such as high temperature oxide (HTO). A thickness of the dielectric layer 114 is about 300 angstroms. A formation temperature of the dielectric layer 114 is about 700 degrees C.

A conductive layer 116 is formed on the dielectric layer 114, wherein the conductive layer 116 is made of a material such as doped polysilicon. The thickness of the conductive layer 116 is about 200 angstroms, and a formation temperature of the conductive layer 116 is about 560 degrees C.

Figure 1D:
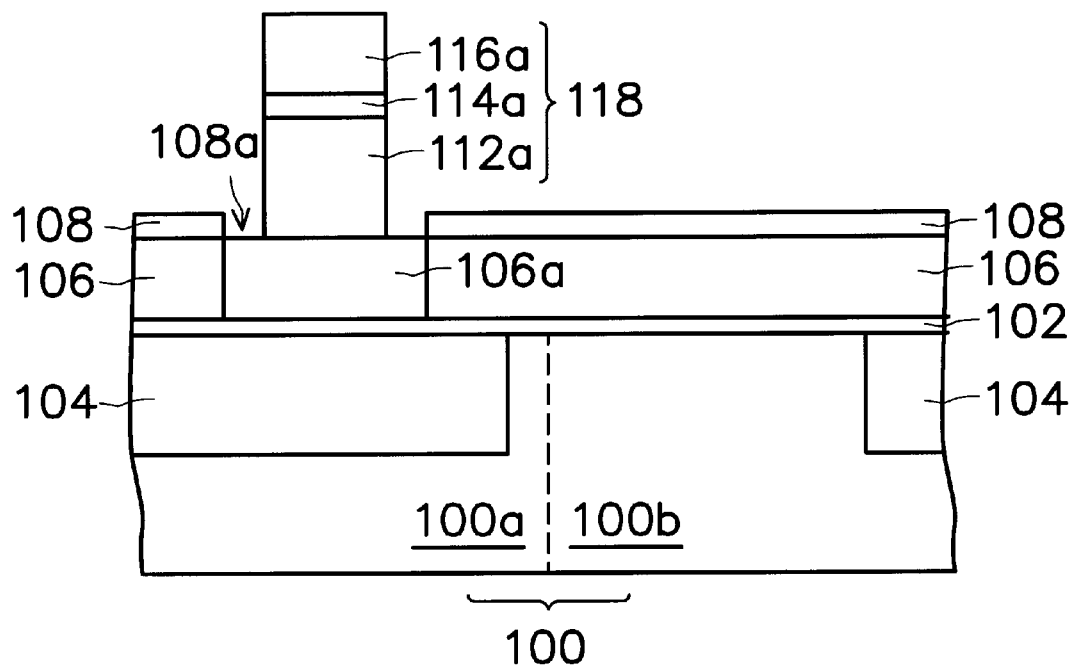

Referring to FIG. 1D, by using the dielectric layer 108 as an etching stop layer, the conductive layer 116, the dielectric layer 114 and the silicide layer 112 are patterned by a photolithography and etching process. As a result, a three-layer structure 118, a capacitor structure, which contains at least the patterned conductive layer 116a, dielectric layer 114a and silicide layer 112a, is formed within the opening 108a. The three-layers structure 118 serves as a capacitor.

The dielectric layer 108 does not only serve as an etching stop layer, but also prevents the polysilicon layer 106 from being damaged in the etching step. The quality of the polysilicon layer 106 is retained, so that the performance of the subsequently formed gate is maintained.

Figure 1E:
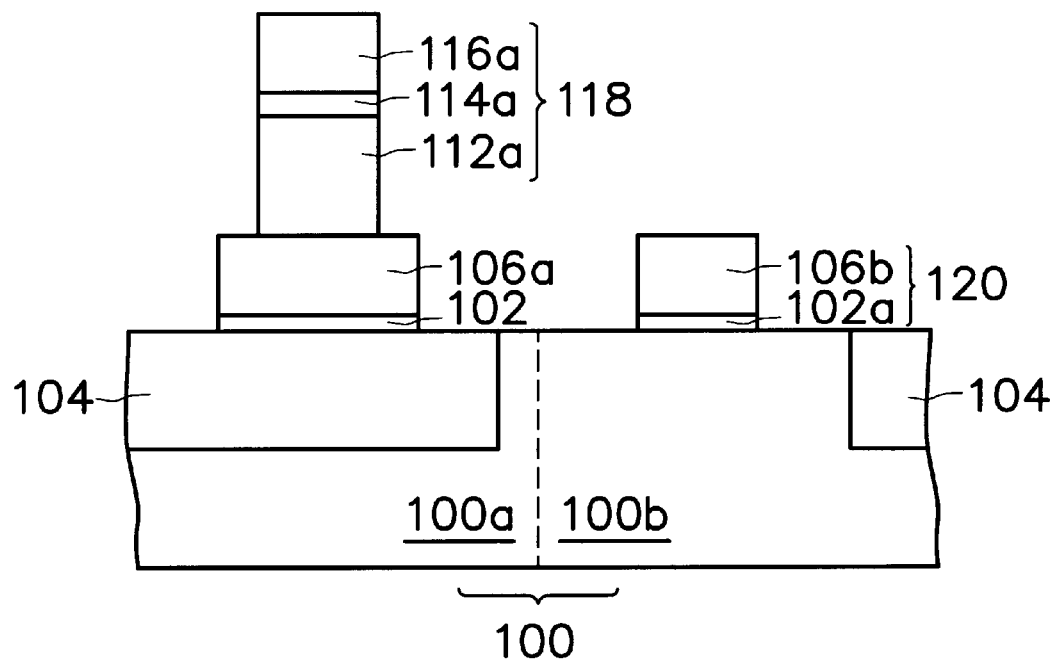

Referring to FIG. 1E, the dielectric layer 108 is removed by wet etching, for example. In brief, the wafer is dipped in hydrofluoric acid (HF) solution to remove the dielectric layer 108.

The polysilicon layer 106 and the gate dielectric layer 102 are patterned to form a two-layer structure 120 in region 100b. The two-layer structure 120 contains the patterned polysilicon layer 106b and the gate dielectric layer 102a. The two-layer structure 120 serves as a gate.

A healing process is performed to eliminate defects in the exposed surface of the three-layer structure 118 (as a capacitor structure) and the two-layer structure 120 (as a gate structure). The healing process is, for example, a dry thermal oxidation, wherein the process temperature is maintained at about 800 degrees C.

A thin passivation layer (not shown) is formed on the exposed surface of the substrate 100 while the healing process is performed. The thin passivation layer can prevent the substrate 100 from being damaged in a subsequent ion implantation process.

Figure 1F:
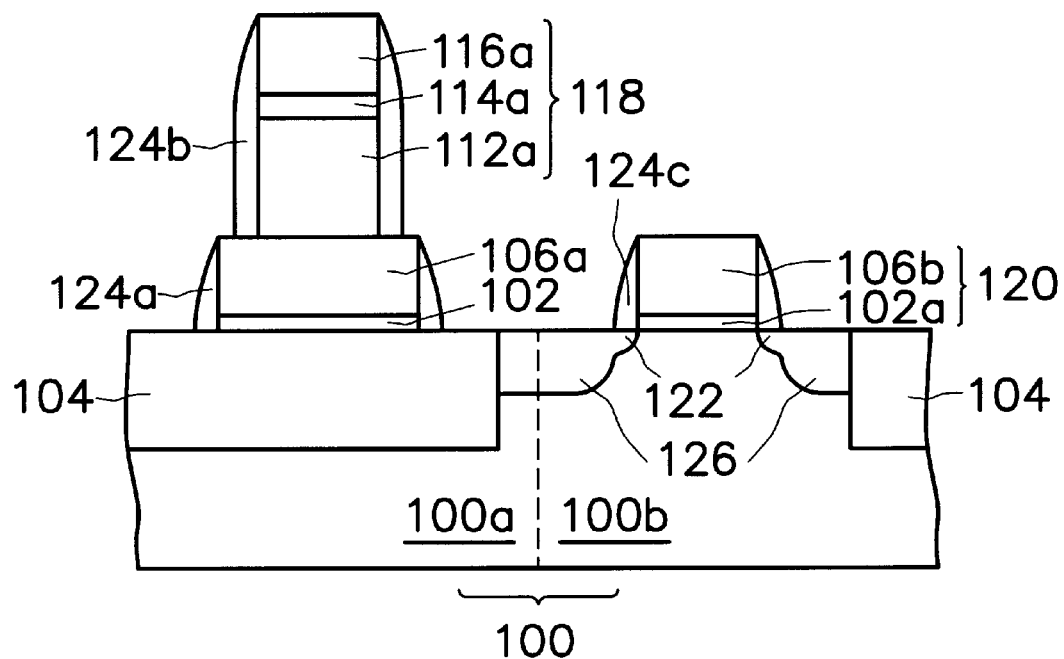

Referring to FIG. 1F, ions are implanted into the region 100b to form a lightly doped drain region 122 by an ion implantation process. Ion type is selected according to the future application of the device.

A silicon oxide layer, which is used as liner layer (not shown), and a silicon nitride layer are formed on the substrate 100 in sequence, wherein both the silicon oxide layer and the silicon nitride layer are conformal to the substrate 100. Then, an etching back process is performed to form spacers 124a, 124b and 124c on each sidewall of the dielectric layer 102 and polysilicon layer 106a, the three-layers structure 118 and the two-layers structure 120, respectively.

Ions are implanted into the region 100b to form a source/drain region 126 by an ion implantation process, for example. Ions are properly selected accordingly to the future application of the device.

In the invention, a photomask is used for forming a doped polysilicon layer in a region predetermined to form a capacitor and a doped polysilicon layer in a region predetermined to form a gate. A silicide layer is formed on the doped polysilicon layer serving as a bottom electrode of a capacitor.

The invention is compatible with the existing process and is simple for a person skilled in the art to incorporate it into an existing process.

The invention provides a method for fabricating a low voltage coefficient capacitor to enhance the performance of a capacitor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a low voltage coefficient capacitor, comprising the steps of:

providing a substrate having a first region and a second region, wherein the first region is for forming a capacitor and the second region is for forming a gate;

forming a gate dielectric layer over the substrate;

forming a polysihcon layer on the gate dielectric layer;

forming a first dielectric layer on the polysilicon layer;

patterning the first dielectric layer to expose a portion of the polysilicon layer in the first region;

implanting ions into the exposed portion of the polysilicon layer to form a doped polysilicon region in the first region;

forming a silicide layer conformal to the substrate;

forming a second dielectric layer on the silicide layer;

forming a conductive layer on the second dielectric layer;

patterning the conductive layer, the second dielectic layer and the silicide layer to form a capacitor structure on the doped polysilicon region in the first region;

removing the first dielectric layer;

patterning the polysilicon layer and the gate dielectric layer to form a gate structure in the second region;

performing a healing process to eliminate defects in exposed surfaces of the capacitor structure and the gate structure;

forming a lightly doped drain in the second region;

forming spacers on each sidewall of the capacitor structure, the gate structure and the doped polysilicon region, respectively; and forming a source/drain region in the second region.

2. The method of claim 1, wherein the gate dielectric layer includes silicon oxide.

3. The method of claim 1, wherein the polysilicon layer is undoped.

4. The method of claim 1, wherein the first dielectric layer includes silicon nitride or silicon oxide.

5. The method of claim 1, wherein the silicide layer includes tungsten silicide.

6. The method of claim 1, wherein the second dielectric layer includes high temperature oxide.

7. The method of claim 1, wherein the conductive layer includes doped polysilicon.

8. The method of claim 1, wherein the healing process includes thermal oxidation.

9. The method of claim 1, wherein the spacers include silicon nitride.

10. A method for forming a low voltage coefficient capacitor, comprising the steps of:

providing a substrate having a first region and a second region, wherein the first region is for forming a capacitor and the second region is for forming a gate;

forming a silicon oxide layer only the substrate;

forming an undoped polysilicon layer on the silicon oxide layer;

forming a first dielectric layer on the undoped polysilicon layer;

performing an ion implantation process on a portion of the undoped polysilicon layer to form a doped polysilicon region within the first region;

forming a tungsten silicide layer conformal to the substrate;

forming a second dielectric layer on the tungsten silicide layer;

forming a conductive layer on the second dielectric layer;

patterning the conductive layer, the second dielectric layer and the silicide layer to form a capacitor structure on the doped polysilicon region within the first region;

removing the first dielectric layer;

patterning the polysilicon layer and the silicon oxide layer to form a gate structure at the second region;

performing a dry oxidation process to eliminate defects on exposed surfaces of the capacitor structure and the gate structure;

forming a lightly doped drain in the second region;

forming spacers on each sidewall of the capacitor structure, the gate structure and the doped polysilicon region, respectively; and forming a source/drain region in the second region.

11. The method of claim 10, wherein the first dielectric layer includes silicon nitride.

12. The method of claim 10, wherein the second dielectric layer includes silicon oxide.

13. The method of claim 10, wherein the second dielectric layer includes high temperature oxide.

14. The method of claim 10, wherein the conductive layer includes doped polysilicon.

15. The method of claim 10, wherein the oxidation process includes thermal oxidation.

16. The method of claim 10, wherein the spacers include silicon nitride.

17. The method a claim 1, erected spacers include silicon oxide.

18. The method of claim 10, wherein the spacers include silicon oxide.

* * * * *